United States Patent
Akaike et al.

(10) Patent No.: US 8,531,223 B2
(45) Date of Patent: Sep. 10, 2013

(54) SIGNAL GENERATOR

(75) Inventors: Kazuo Akaike, Sayama (JP); Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 1 day.

(21) Appl. No.: 13/433,935

(22) Filed: Mar. 29, 2012

(65) Prior Publication Data

US 2012/0249203 A1 Oct. 4, 2012

(30) Foreign Application Priority Data

Mar. 31, 2011 (JP) ................................ 2011-080031

(51) Int. Cl.
*H03B 21/00* (2006.01)
(52) U.S. Cl.
USPC ........................... 327/184; 327/105; 327/107
(58) Field of Classification Search
None
See application file for complete search history.

(56) References Cited

U.S. PATENT DOCUMENTS

| | | | | | |
|---|---|---|---|---|---|
| 4,792,914 | A | * | 12/1988 | Dartois et al. | 708/8 |
| 4,835,481 | A | * | 5/1989 | Geissler et al. | 327/156 |
| 5,877,752 | A | * | 3/1999 | Puthuff et al. | 345/180 |
| 5,920,273 | A | * | 7/1999 | Hirano | 341/144 |
| 7,103,622 | B1 | * | 9/2006 | Tucholski | 708/276 |

FOREIGN PATENT DOCUMENTS

JP 5-206732 8/1993

* cited by examiner

*Primary Examiner* — Tuan T Lam
(74) *Attorney, Agent, or Firm* — Jordan and Hamburg LLP

(57) ABSTRACT

There is provided a signal generator outputting an analog frequency signal based on a digital value according to a set frequency, which provides excellent noise characteristics, requires no ROM table corresponding to waveform data, and has a simple configuration. A digital signal having a digital value according to a set frequency is integrated to generate a waveform in a sawtooth shape, a waveform in a triangular wave shape is generated based on the waveform, and this waveform output is differentiated and then D/A converted and integrated. A comparator using, for example, the voltage at a midpoint of the triangular wave as a threshold value is used for the integrated output, and a frequency signal of an objective frequency is obtained from the comparator.

2 Claims, 8 Drawing Sheets

Fig. 3

| CLOCK NUMBER | INPUT VALUE | OUTPUT VALUE | DECIMAL VALUE |
|---|---|---|---|
| 0 | 1 | 0000 | 0 |
| 1 | 1 | 0001 | 1 |
| 2 | 1 | 0010 | 2 |
| 3 | 1 | 0011 | 3 |
| 4 | 1 | 0100 | 4 |
| 5 | 1 | 0101 | 5 |
| 6 | 1 | 0110 | 6 |
| 7 | 1 | 0111 | 7 |
| 8 | 1 | 1000 | -8 |
| 9 | 1 | 1001 | -7 |
| 10 | 1 | 1010 | -6 |
| 11 | 1 | 1011 | -5 |
| 12 | 1 | 1100 | -4 |
| 13 | 1 | 1101 | -3 |
| 14 | 1 | 1110 | -2 |
| 15 | 1 | 1111 | -1 |
| 16 | 1 | 0000 | 0 |
| 17 | 1 | 0001 | 1 |
| 18 | 1 | 0010 | 2 |

(a)

(b)

SIGNAL GENERATOR

BACKGROUND OF THE INVENTION

1. Field of the Invention

The present invention relates to a signal generator for obtaining a frequency signal.

2. Description of the Related Art

A device for generating an arbitrary frequency signal is required, for example, in order to obtain a clock signal according to a system, and a method of combining a D/A (digital/analog conversion unit) and DDS (Direct Digital Synthesizers) is known in order to obtain an analog frequency signal based on a frequency setting signal composed of a digital signal. When receiving an inputted digital signal corresponding to a set frequency, the DDS in which data for creating a sinusoidal signal is written in a ROM table, reads an address in a read pattern according to the input value and thereby outputs a sinusoidal signal corresponding to the set frequency from the ROM table. The output is converted into an analog signal in the D/A conversion unit and thereby the objective analog frequency signal is obtained.

In this case, it is necessary to increase the resolution for data in the ROM table in order to improve the noise characteristics such as spurious and the like of the generated signal, which requires a large memory capacity and a large consumption current.

Patent Document 1 discloses a technique of generating a rectangular wave of an objective frequency based on a triangular wave of digital data. In this technique, after D/A conversion of the digital data, the analog triangular wave is linearly interpolated. The purpose of linear interpolation is to fix the zero cross timing to a timing according to the frequency because the timing of the analog triangular wave crossing a zero point cannot be made more accurate than a sample timing of the digital signal (paragraphs 0019 to 0023). Then, a comparator is used to obtain the zero cross timing of the analog triangular wave to obtain an output (paragraph 0024).

Patent Document 1 states that a digital signal is inputted into an adder to generate a sawtooth wave proportional to input and time, then the sawtooth wave is converted into a triangular wave in a triangular wave conversion circuit, the triangular wave is D/A converted, the analog triangular wave is linearly interpolated, and the output of a linear interpolation circuit is further binarized by a predetermined voltage in a comparator to obtain an arbitrary frequency signal.

However, an operational amplifier is necessary for a sample hold circuit used for linear interpolation, and there is a problem that when the operational amplifier being an active element is used, the fluctuation in gain causes a waveform distortion.

Patent Document 1: Japanese Patent Application Laid-open No. Hei 5-206732 (paragraphs 0019 to 0024, FIG. 1)

SUMMARY OF THE INVENTION

The present invention has been made under such circumstances, and its object is to provide a signal generator for outputting an analog frequency signal based on a digital value according to a set frequency, which provides excellent noise characteristics, requires no ROM table corresponding to waveform data, and has a simple configuration.

A signal generator of the present invention includes:

an integrated waveform generation unit receiving an inputted digital signal having a digital value according to a set frequency and integrating the digital value to generate an integrated waveform in a sawtooth shape in which a negative value and a positive value are combined;

a triangular wave generation unit inverting a digital value outputted from the integrated waveform generation unit to generate a waveform in a triangular wave shape comprised by a digital value;

a differential circuit unit differentiating an output of the triangular wave generation unit to generate a waveform in a rectangular wave shape in which the positive value and the negative value are repeated;

a digital/analog conversion unit digital/analog converting an output of the differential circuit unit;

an integration circuit unit integrating an analog output of the digital/analog conversion unit and outputting an integrated waveform in a triangular wave shape; and a comparator comparing an output of the integration circuit unit and a preset threshold value and outputting a rectangular wave of an objective frequency being a comparison output.

EFFECT OF THE INVENTION

The present invention is a signal generator outputting an analog frequency signal based on a digital value according to a set frequency, in which a digital signal having a digital value according to the set frequency is integrated to generate a waveform in a sawtooth shape, a waveform in a triangular wave shape is generated based on the waveform, and this waveform output is differentiated and then D/A converted and integrated to obtain the frequency signal of an objective frequency by a comparator for the integrated output. Accordingly, the ROM table corresponding to the waveform data used in the DDS becomes unnecessary, and excellent noise characteristics can be obtained even with the simple configuration.

BRIEF DESCRIPTION OF THE DRAWINGS

FIG. 3 is an explanatory view illustrating the operation of the integrated waveform generation unit;

DETAILED DESCRIPTION OF THE PREFERRED EMBODIMENTS

Figure 1:
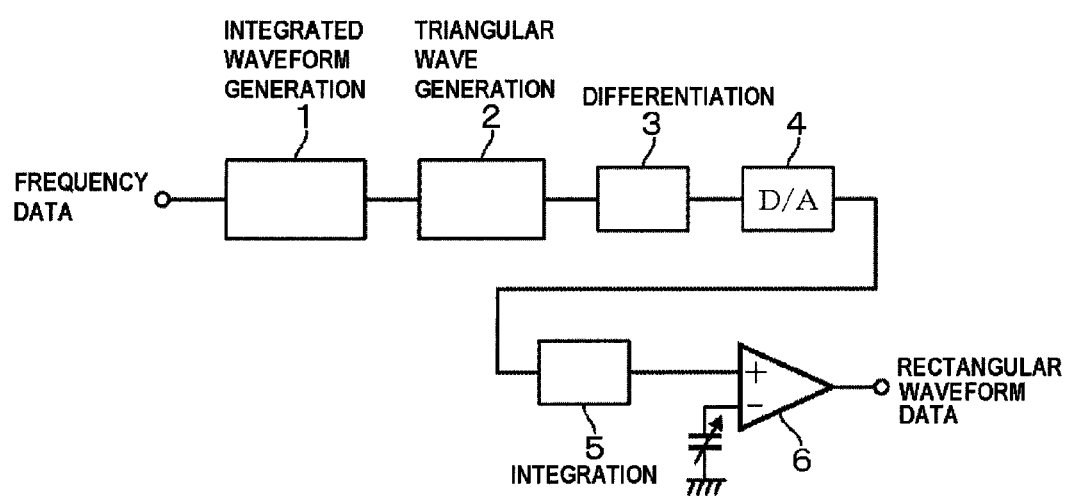
FIG. 1 is a block diagram illustrating the whole configuration of an embodiment of a signal generator of the present invention.
Figure 2:
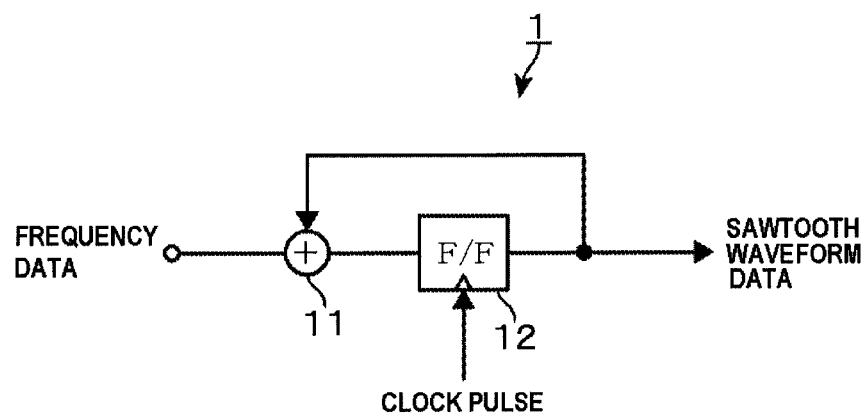
FIG. 2 is a block diagram illustrating circuits of an integrated waveform generation unit.

FIG. 1 is a block diagram illustrating the whole configuration of an embodiment of a signal generator of the present invention, in which a numeral 1 denotes an integrated waveform generation circuit unit. The integrated waveform generation circuit unit 1 has a function to output, as digital data, a sawtooth wave of a frequency according to the inputted digital value (frequency data), and is provided with a flip-flop circuit 12 at a stage subsequent to an addition unit 11 and configured to add, in the addition unit 11, the output from the flip-flop circuit 12 and the input value as illustrated in FIG. 2. A clock pulse is inputted into the flip-flop circuit 12, and the input data from the addition unit 11 is outputted at a timing of input of the clock pulse. The frequency of the clock pulse is set, for example, to about 20 MHz when, for example, 5 MHz is desired as the frequency of the sawtooth wave specified by an outputted digital value group.

Figure 4:
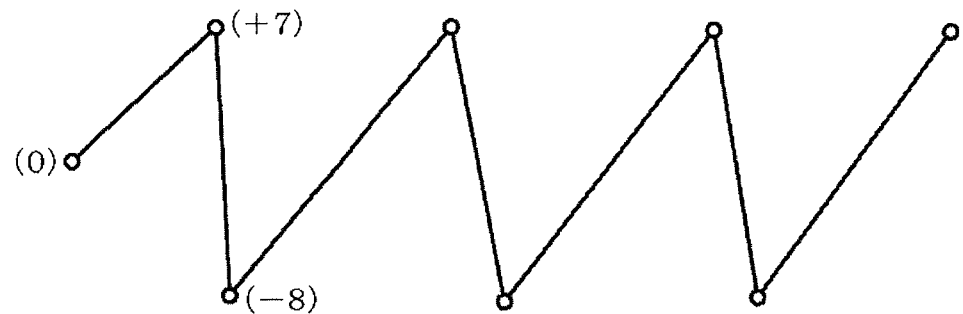
FIG. 4 is a waveform chart illustrating an output waveform of the integrated waveform generation unit.

The operation of the integrated waveform generation circuit unit 1 will be described with reference to FIG. 3 exemplifying the case that it operates with a 4-bit digital value for convenience of description. The digital value is handled as a complement of "2." Assuming that the input value being the frequency data inputted into the circuit unit 1 is, for example, "0001," the input value and the addition unit 11 are added to increase the sum, and when the sum reaches "0111" and then "0001" is inputted, the sum becomes "1000" and the decimal value changes into a negative value. Accordingly, the relation among the pulse number (number of convenience) of the clock pulse inputted into the flip-flop circuit 12 and the frequency data (input value) and the output value is as presented in FIG. 3, and the output waveform becomes a sawtooth wave being an integrated waveform of the input value as illustrated in FIG. 4. Since the frequency of the sawtooth wave is determined according to the input value being the set frequency data, the frequency data is data determining the set frequency of a signal generator as will be described later. Note that the digital signal of the integrated waveform generation circuit unit 1 is explained as being four bits, but a signal of, for example, 32 bits is actually used.

Figure 5:
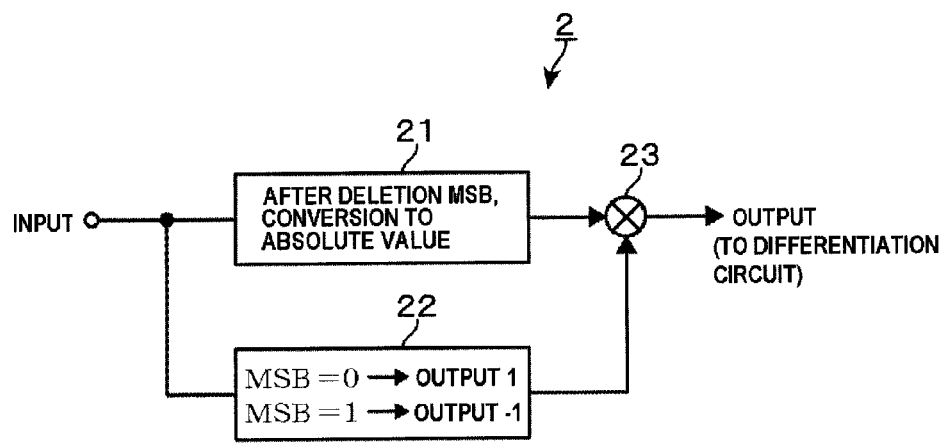
FIG. 5 is a block diagram illustrating circuits of a triangular wave generation unit.
Figure 5:
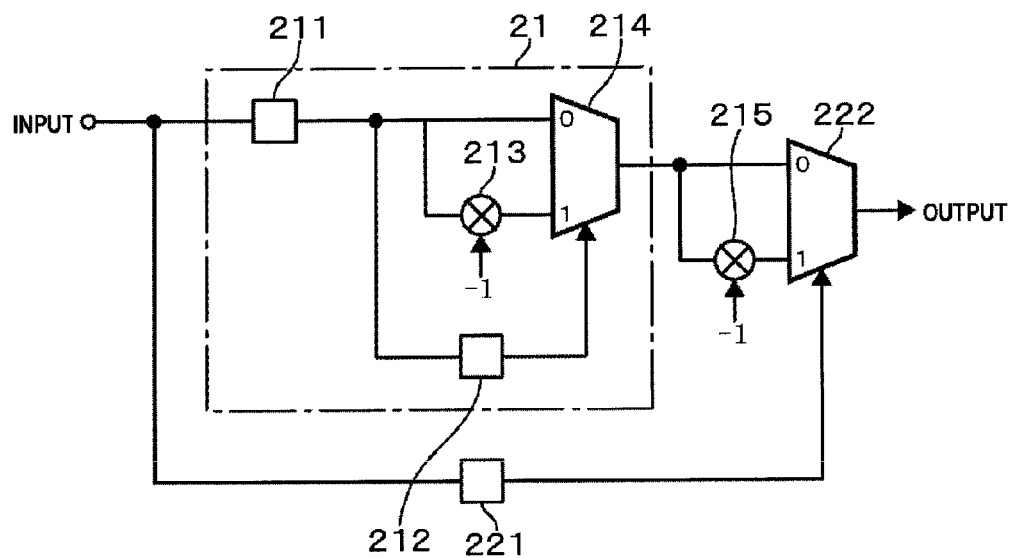

A triangular wave generation circuit unit 2 is provided at a stage subsequent to the integrated waveform generation circuit unit 1. The triangular wave generation circuit unit 2 is for converting the inputted sawtooth wave into a triangular wave and is configured as shown in FIG. 5 (a), for example. An absolute value calculation unit 21 is a circuit unit which deletes a MSB (Most Significant Bit) from inputted bit signal (digital signal) and obtains an absolute value of lower bits excluding MSB. A positive/negative judgement unit 22 is a circuit unit which outputs "1" when the MSB of the digital signal is "0", and outputs "−1" when the MSB of the digital signal is "1". A multiplication unit 23 is a circuit unit that multiplies the absolute value obtained by the absolute value calculation unit 21, by the output value outputted from the positive/negative judgement unit 22.

Therefore, if the MSB of inputted bit signal is "0", the positive/negative judgement unit 22 outputs "1", and the multiplication unit 23 multiplies the absolute value of lower bits of the bit signal after deleting MSB by "1", and outputs the results. Otherwise, when the inputted digital value is a negative value (that is, MSB is "1"), the positive/negative judgement unit 22 outputs "−1" and the multiplication unit 23 multiplies the absolute value of lower bits of the bit signal after deleting MSB by "4", and outputs the results.

Figure 6:
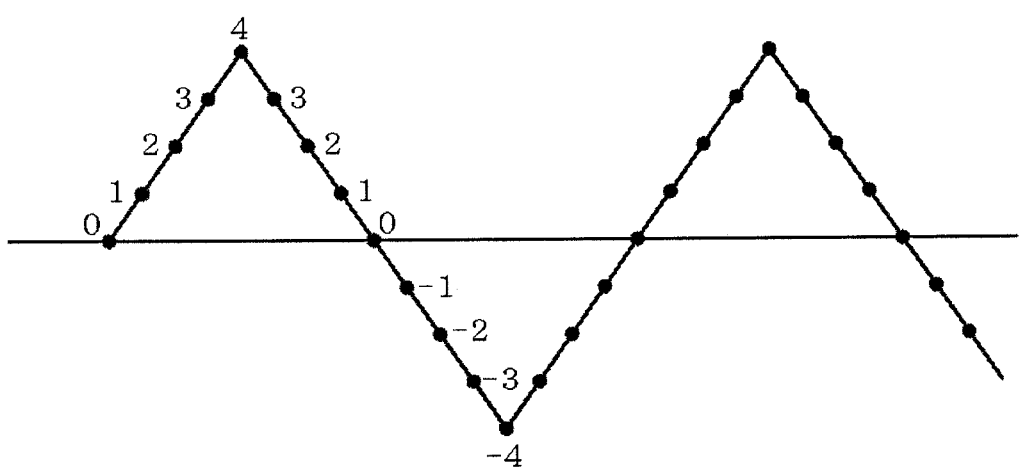
FIG. 6 is a waveform chart illustrating an output waveform of the triangular wave generation unit.

In the circuit unit shown in FIG. 5 (a), when the integrated waveform generation circuit unit 1 outputs from "0000" to "0100", the decimal number of them increases from 0 in increments of 1. And after deleting MSB, "0101" becomes "101", so the absolute value of it in two complement state is 3. Therefore, after "0100", the decimal number decreases from 4 in decrements of 1. So as a result, the triangular wave in FIG. 6 is obtained.

FIG. 5(b) is an example of the circuit made by embodying the block in FIG. 5(a). A numeral 211 denotes a circuit deleting MSB of the inputted bit signal and outputting the resulting signal. Numerals 212, 221 denote circuits each judging 1/0 of MSB, numerals 214, 222 are select circuits each outputting a signal inputted into an input end on a "0" side if the select signal is "0" and outputting a signal inputted into an input end on a "1" side if the select signal is "1," and numerals 213, 215 are multiplication units each multiplying with "−1."

Note that the digital data is not limited to two complement state, and methods converting a sawtooth wave into a triangular wave is not limited to the methods described above.

Also note that the triangular wave generation circuit unit 2 may be configured to invert the positive region in the inputted sawtooth wave into a negative value, and also may be configured to invert the negative region into a positive value.

Figure 7:
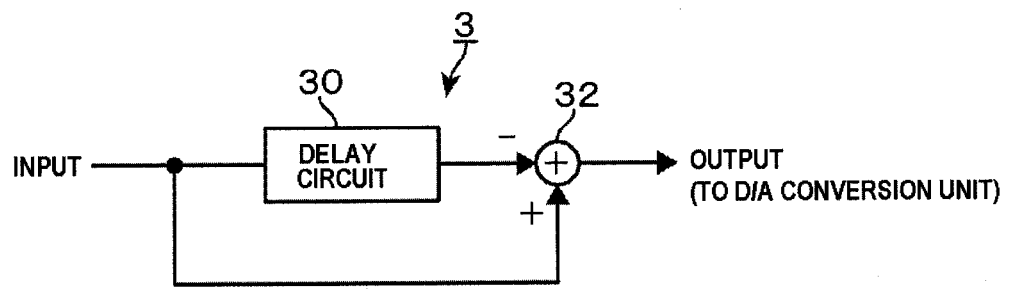
FIG. 7 is a block diagram illustrating circuits of a differentiation circuit unit.

At a stage subsequent to the triangular wave generation circuit unit 2, a differentiation circuit unit 3 is provided. The differentiation circuit unit 3 is provided with an addition unit 32 at a stage subsequent to a delay to circuit unit 31 as illustrated in FIG. 7, and is configured to subtract, from an input value inputted into the differential circuit unit 3, an input value at a timing, for example, previous to the input value, namely, an input value held by a previous clock in the delay circuit unit 31, and output the difference between them.

Figure 8:
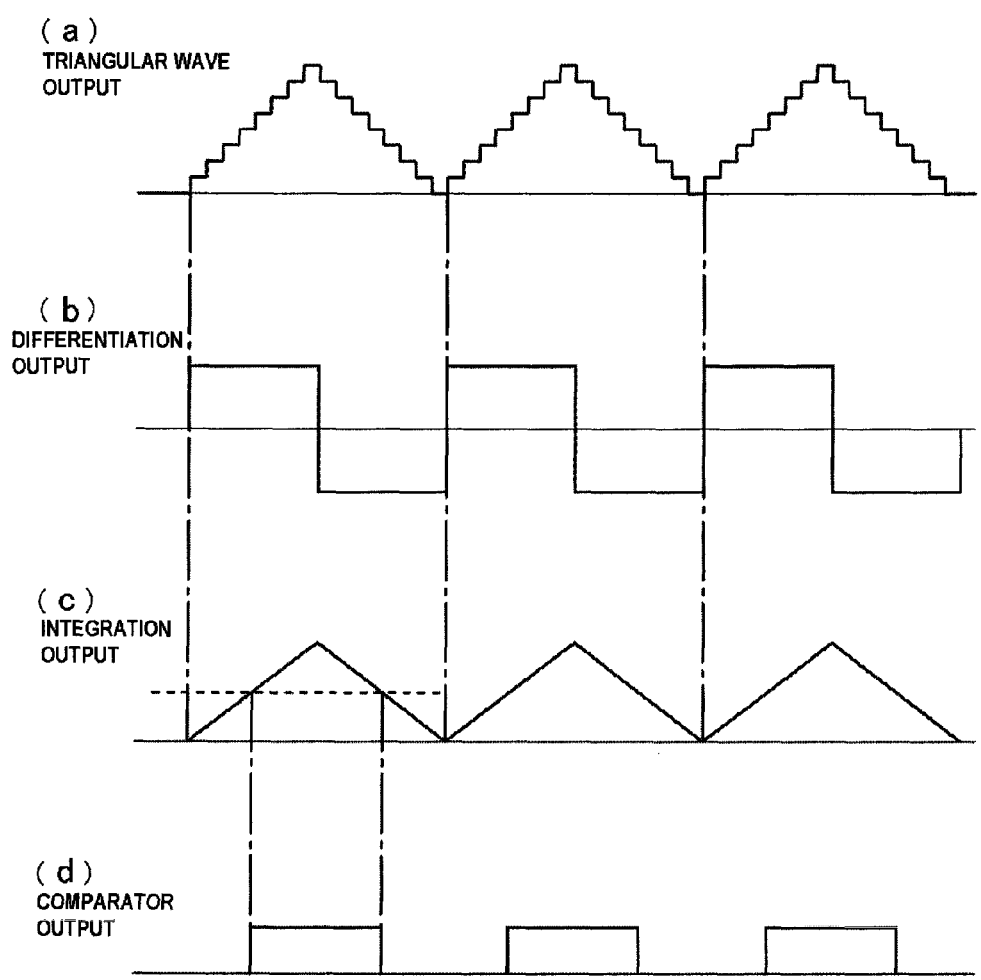
FIG. 8 is a time chart illustrating the appearance of obtaining an objective frequency signal by processing an output signal of the triangular wave generation unit by circuits at subsequent stages.

FIG. 8(a) is a triangular wave generated in the triangular wave generation circuit unit 2 which is a stepwise waveform according to the operation clock because it is digital data. Accordingly, by differentiating the triangular wave, a rectangular wave with a duty ratio of 50% composed of digital values in which a positive value and a negative value alternatingly appear respectively corresponding to a rising region and a lowering region of the triangular wave is obtained as illustrated in FIG. 8(b).

At stages subsequent to the differentiation circuit unit 3, a D/A conversion unit 4 and an integration circuit 5 are provided, so that the rectangular wave outputted from the differentiation circuit unit 3 is D/A converted. The integration circuit 5 integrates an analog rectangular wave to generate a triangular wave as illustrated in FIG. 8(c).

At a stage subsequent to the integration circuit 5, a comparator 6 is provided, and the threshold value (voltage) of the comparator 6 is set to a voltage, for example, at a midpoint of the signal level of the triangular wave. Since the output level and the frequency of the differentiation circuit unit 3 are known, the voltage at the midpoint is known. Accordingly, during the time when the voltage of the triangular wave exceeds the threshold value, the output of the comparator 6 becomes ON and a predetermined DC voltage is outputted, whereas when the voltage of the triangular wave becomes equal to or less than the threshold value, the output of the comparator 6 becomes OFF and the output voltage level becomes zero. Therefore, a rectangular wave with a duty ratio of 50% is outputted from the comparator 6. Note that the threshold value of the comparator 6 is not limited to be set to the voltage at the midpoint of the signal level of the triangular wave but is determined depending on the duty ratio of the objective rectangular wave.

Collectively explaining the operation of the above embodiment, frequency data corresponding to the objective frequency to be obtained from a signal generator is first set by a not-illustrated setting unit and inputted into the integrated waveform generation circuit unit 1. In the integrated waveform generation circuit unit 1, a sawtooth wave of the frequency according to the frequency data is generated as has been described, and then the negative region of the sawtooth wave is inverted to the positive value or conversely the positive region is inverted to the negative value as has been described to generate a triangular wave.

Then, the triangular wave is differentiated and the differential output is D/A converted and integrated, thereby obtaining the triangular wave made by removing the stepwise portion from the triangular wave formed of the stepwise line illustrated in FIG. 8(a) (see FIG. 8(c)). Further, this triangular wave is inputted into the comparator 6 to obtain a rectangular wave. The differential output is the output with a duty ratio of 50% that is the frequency according to the frequency data, and therefore the rectangular wave obtained from the comparator 6 becomes a pulse signal of the objective frequency, for example, 5 MHz.

As described above, according to the above embodiment, the following effects are provided.

A ROM table in which data for creating a sinusoidal signal used in a DDS is written becomes unnecessary, leading to a simple configuration with a reduced circuit scale and a reduction in power consumption.

Both characteristics are provided which are the characteristic of the digital signal processing that fine and accurate adjustment can be performed and the characteristic of the analog circuit that the quantization noise can be ignored.

Further, the D/A converted value is integrated to generate a triangular wave, and the integration circuit 5 can be constituted of a passive element such as a resistor element, a capacitor or the like, so that a signal with less waveform distortion and lower noise as compared to that of the already-described method of Patent Document 1 can be obtained.

What is claimed is:

1. A signal generator, comprising:
   an integrated waveform generation unit receiving an inputted digital signal having a digital value according to a set frequency and integrating the digital value to generate an integrated waveform in a sawtooth shape in which a negative value and a positive value are combined;
   a triangular wave generation unit inverting a digital value outputted from the integrated waveform generation unit to generate a waveform in a triangular wave shape comprised by a digital value;
   a differential circuit unit differentiating an output of said triangular wave generation unit to generate a waveform in a rectangular wave shape in which the positive value and the negative value are repeated;
   a digital/analog conversion unit digital/analog converting an output of said differential circuit unit;
   an integration circuit unit integrating an analog output of said digital/analog conversion unit and outputting an integrated waveform in a triangular wave shape; and
   a comparator comparing an output of said integration circuit unit and a preset threshold value and outputting a rectangular wave of an objective frequency being a comparison output.

2. The signal generator according to claim 1, wherein;
   the digital value is two complement, and;
   the triangular wave generation unit is comprising a circuit unit which obtains an absolute value of the digital signal outputted from the integrated waveform generation unit after deleting MSB, and a circuit unit which multiplies the absolute value by 1 when the MSB is 0 and multiples the absolute value by −1 when the MSB is 1.

\* \* \* \* \*